(12) United States Patent
Brew et al.

(10) Patent No.: US 10,305,054 B2
(45) Date of Patent: May 28, 2019

(54) MEMRISTIVE DEVICE BASED ON TUNABLE SCHOTTKY BARRIER

(71) Applicant: International Business Machines Corporation, Armonk, NY (US)

(72) Inventors: Kevin W. Brew, Ronkonkoma, NY (US); Guy M. Cohen, Ossining, NY (US); Talia S. Gershon, White Plains, NY (US); Yun Seog Lee, White Plains, NY (US); Ning Li, White Plains, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/496,740

(22) Filed: Apr. 25, 2017

(65) Prior Publication Data

US 2018/0309075 A1    Oct. 25, 2018

(51) Int. Cl.
*H01L 51/00* (2006.01)
*H01L 51/10* (2006.01)
(Continued)

(52) U.S. Cl.
CPC ........ *H01L 51/102* (2013.01); *G11C 11/5664* (2013.01); *G11C 13/004* (2013.01); *G11C 13/0014* (2013.01); *G11C 13/0016* (2013.01); *G11C 13/0064* (2013.01); *G11C 13/0069* (2013.01); *H01L 51/0003* (2013.01); *H01L 51/0008* (2013.01); *H01L 51/0591* (2013.01); *H01L 51/105* (2013.01); *G11C 13/0007* (2013.01); *G11C 2013/0066* (2013.01);
(Continued)

(58) Field of Classification Search
CPC ............ G11C 2213/81; G11C 2213/82; G11C 2213/51
See application file for complete search history.

(56) References Cited

U.S. PATENT DOCUMENTS

| 7,704,785 B2 | 4/2010 | Steiger et al. |
| 8,207,519 B2 | 6/2012 | Nickel et al. |
(Continued)

OTHER PUBLICATIONS

V. De Renzi et al., "Metal work-function changes induced by organic adsorbates: A combined experimental and theoretical study," Physical Review Letters, vol. 95, No. 4, Jul. 2005, 046804, 4 pages.
(Continued)

*Primary Examiner* — Nicholas J Tobergte
(74) *Attorney, Agent, or Firm* — Vazken Alexanian; Michael J. Chang, LLC

(57) ABSTRACT

Memristive devices based on tunable Schottky barrier are provided. In one aspect, a method of forming a memristive device includes: forming a semiconductor layer on a bottom metal electrode, wherein the semiconductor layer has work-function-modifying molecules embedded therein; and forming a top metal electrode on the semiconductor layer, wherein the top metal electrode forms a Schottky junction with the semiconductor layer, and wherein the workfunction-modifying molecules are configured to alter a workfunction of the top metal electrode. A memristive device and a method for operating a memristive device are also provided.

21 Claims, 11 Drawing Sheets

(51) Int. Cl.
*H01L 51/05* (2006.01)
*G11C 13/00* (2006.01)
*G11C 11/56* (2006.01)

(52) U.S. Cl.
CPC .. *G11C 2013/0092* (2013.01); *G11C 2213/52* (2013.01); *H01L 2251/301* (2013.01)

(56) References Cited

U.S. PATENT DOCUMENTS

| | | | | |
|---|---|---|---|---|
| 8,343,813 | B2* | 1/2013 | Kuse | H01L 45/146 |
| | | | | 257/2 |
| 8,891,283 | B2 | 11/2014 | Strukov | |
| 9,177,997 | B2* | 11/2015 | Nelles | G11C 13/0007 |
| 9,318,717 | B1 | 4/2016 | Afzali-Ardakani et al. | |
| 2012/0063197 | A1* | 3/2012 | Yang | G11C 13/0007 |
| | | | | 365/148 |
| 2012/0153249 | A1* | 6/2012 | Zhang | H01L 45/08 |
| | | | | 257/4 |
| 2012/0176831 | A1* | 7/2012 | Xiao | G11C 13/0007 |
| | | | | 365/148 |
| 2014/0150859 | A1 | 6/2014 | Zakhidov et al. | |
| 2015/0041751 | A1* | 2/2015 | Zhang | H01L 29/47 |
| | | | | 257/4 |
| 2015/0053908 | A1* | 2/2015 | Fowler | H01L 45/04 |
| | | | | 257/4 |
| 2015/0105560 | A1 | 4/2015 | Berny et al. | |
| 2016/0155972 | A1 | 6/2016 | Chen | |
| 2017/0047512 | A1* | 2/2017 | Bessonov | H01G 7/06 |
| 2017/0299544 | A1* | 10/2017 | Friedman | G01N 27/4141 |

OTHER PUBLICATIONS

C. S. Lee et al., "Interface dipole at metal-organic interfaces: Contribution of metal induced interface states," Applied Physics Letters, vol. 94, No. 11, Mar. 2009, 113304, 3 pages.

T. Berzina et al., "Optimization of an organic memristor as an adaptive memory element," Journal of Applied Physics, vol. 105, No. 12, Jun. 2009, 124515, 5 pages.

B-B. Cui et al., "Tuning of resistive memory switching in electropolymerized metallopolymeric films," Chemical Science, vol. 6, No. 2, 2015, pp. 1308-1315 (published Nov. 2014).

Yang et al., "Memristive Devices for Computing: Mechanisms, Applications and Challenges," USLI Process Integration 8 at the 224th Electrochemical Society Meeting (Oct. 27-Nov. 1, 2013) (7 pages).

D. Kim, "Schottky Barrier Formation," Submitted as Coursework for AP272, Stanford University (Mar. 2007) (8 pages).

Bagus et al., "Work Function Changes Induced by Charged Adsorbates: Origin of the Polarity Asymmetry," Physical Review Letters, 100, 126101 (Mar. 2008) (4 pages).

* cited by examiner

MEMRISTIVE DEVICE BASED ON TUNABLE SCHOTTKY BARRIER

FIELD OF THE INVENTION

The present invention relates to memristive devices and more particularly, to memristive devices based on tunable Schottky barrier.

BACKGROUND OF THE INVENTION

Memristive devices are electrical switches that can retain a state of internal resistance based on an applied voltage and current. See, for example, Yang et al., "Memristive Devices for Computing: Mechanisms, Applications and Challenges," USLI Process Integration 8 at the 224th Electrochemical Society Meeting (October 27-Nov. 1, 2013) (7 pages). Memristive devices have gained significant interest for accelerated machine learning applications.

Memristive devices need to have the following characteristics. Memristive devices have to be non-volatile and capable of storing a continuously variable resistance value. This resistance can be tuned up and down using current or voltage pulses. Memristive device resistance needs to be symmetrically tunable, meaning that when + or − voltage pulses are applied to the device, the resistance moves up or down by roughly the same magnitude.

There is a need for creating a device which can have these resistive switching characteristics.

SUMMARY OF THE INVENTION

The present invention provides memristive devices based on tunable Schottky barrier. In one aspect of the invention, a method of forming a memristive device is provided. The method includes: forming a semiconductor layer on a bottom metal electrode, wherein the semiconductor layer has workfunction-modifying molecules embedded therein; and forming a top metal electrode on the semiconductor layer, wherein the top metal electrode forms a Schottky junction with the semiconductor layer, and wherein the workfunction-modifying molecules are configured to alter a workfunction of the top metal electrode.

In another aspect of the invention, another method of forming a memristive device is provided. The method includes: forming a semiconductor layer on a bottom metal electrode; depositing workfunction-modifying molecules onto the semiconductor layer; and forming a top metal electrode on the semiconductor layer, wherein the top metal electrode forms a Schottky junction with the semiconductor layer, and wherein the workfunction-modifying molecules are configured to alter a workfunction of the top metal electrode.

In yet another aspect of the invention, a memristive device is provided. The memristive device includes: a bottom metal electrode; a semiconductor layer on the bottom metal electrode; a top metal electrode on the semiconductor layer, wherein the top metal electrode forms a Schottky junction with the semiconductor layer; and workfunction-modifying molecules at an interface between the semiconductor layer and the top metal electrode, wherein the workfunction-modifying molecules are configured to alter a workfunction of the top metal electrode.

In still yet another aspect of the invention, a method for operating a memristive device is provided. The method includes: providing the memristive device having a bottom metal electrode, a semiconductor layer on the bottom metal electrode, a top metal electrode on the semiconductor layer, wherein the top metal electrode forms a Schottky junction with the semiconductor layer, and workfunction-modifying molecules at an interface between the semiconductor layer and the top metal electrode; and applying a voltage pulse to the bottom metal electrode and the top metal electrode to align the workfunction-modifying molecules along the top metal electrode which alters a workfunction of the top metal electrode and changes a barrier height of the Schottky junction.

A more complete understanding of the present invention, as well as further features and advantages of the present invention, will be obtained by reference to the following detailed description and drawings.

DETAILED DESCRIPTION OF PREFERRED EMBODIMENTS

Figure 1:
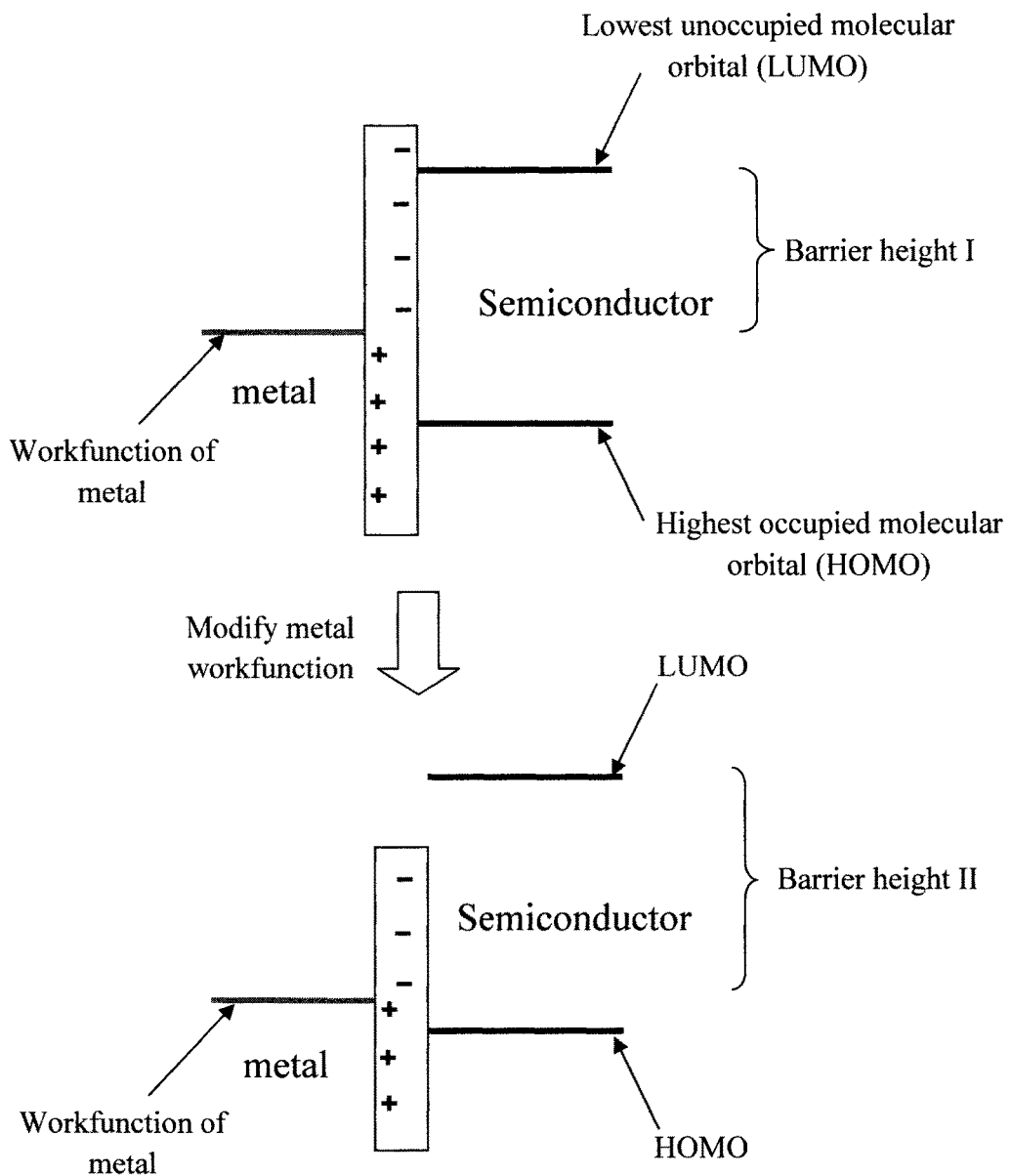
FIG. 1 is a schematic diagram illustrating a Schottky barrier device between a semiconductor and a metal electrode, and how modification of the workfunction of the metal electrode modulates the barrier height according to an embodiment of the present invention.

As provided above, the switching characteristics of a memristive device are such that a positive or a negative (+/−) voltage pulse must be able to change the resistance state of the device, and the switching must be symmetric (i.e., gradual for both + and − pulses, and no abrupt changes to the resistance state). An additional requirement is that the resistance value stored in the device can be read without altering the stored resistance value. This is done using a much smaller voltage pulse than the set voltage. Advantageously, provided herein are techniques for fabricating memristive devices having this gradual/symmetric switching characteristic, which to date has proven to be the hardest part in creating these kinds of devices.

As will be described in detail below, the present techniques involve modulating the barrier height of a Schottky barrier device to control the resistance of the device for memristive applications. More specifically, a Schottky barrier device is created between a semiconductor layer and a metal (or electrically conductive oxide) electrode, and then the barrier height is modulated using small dipole or charged molecules which are aligned or randomly oriented along the metal electrode. A dipole molecule (or polar molecule) has a net charge of zero, but has a charge distribution within the molecule. A charged molecule has a non-zero net charge.

Since the both dipole and charged molecules have an uneven charge distribution in the molecules, they can be used to modulate the barrier height by altering the workfunction of the metal electrode (see below). Accordingly, these molecules (polar/charged) will also be referred to herein generally as "workfunction-modifying" molecules.

In accordance with the present techniques, a memristive device is created having at least one Schottky contact (i.e., the semiconductor layer with non-Ohmic/Schottky contact to the metal (or electrically conductive metal oxide) electrode). The height of the barrier in this Schottky contact dictates the contact resistance.

The Schottky barrier height ($\Phi_B$) depends on i) doping and consequently the Fermi level ($E_F$) and band edge positions (X) in the semiconductor, ii) workfunction of the metal electrode ($\Phi_M$), and iii) any Fermi level pinning at the semiconductor/metal electrode interface. See, for example, FIG. 1 in D. Kim, "Schottky Barrier Formation," Submitted as Coursework for AP272, Stanford University (March 2007) (hereinafter "Kim"), the contents of which are incorporated by reference as if fully set forth herein. As described in Kim, the current-density (J) in the metal to semiconductor junction can be expressed as:

$$J = A^* T^2 \exp\left(-e\frac{\varphi_{Bn}}{kT}\right)\left(\exp\left(\frac{enV_a}{kT}\right) - 1\right), A^* = \frac{4\pi e m_n^* k^2}{h^3}, \quad (1)$$

wherein $V_a$ is the applied bias, n is the realization (fitting) factor, and $\varphi_{Bn}$ is the Schottky Barrier height. As can be seen from Equation 1, the current J that flows across the device is inversely proportional to the Schottky Barrier height $\varphi_{Bn}$. Thus, a change in the Schottky Barrier height can change how much current flows through the device.

This notion is leveraged in the present techniques to tune the Schottky Barrier height and thereby tune the voltage across the device. More specifically, the workfunction of the metal electrode is modified through the assembly of the workfunction-modifying (e.g., dipole or charged) molecules, thereby modulating the barrier height (and hence the resistance across the device). See, for example, FIG. 1. As shown in FIG. 1, for a given metal electrode/semiconductor interface, the barrier height can be changed (in this example from Barrier height I to Barrier height II) by modifying the workfunction of the metal electrode. In accordance with the present techniques, this workfunction modification is accomplished by introducing the workfunction-modifying molecules and controlling their arrangement.

Figure 2:
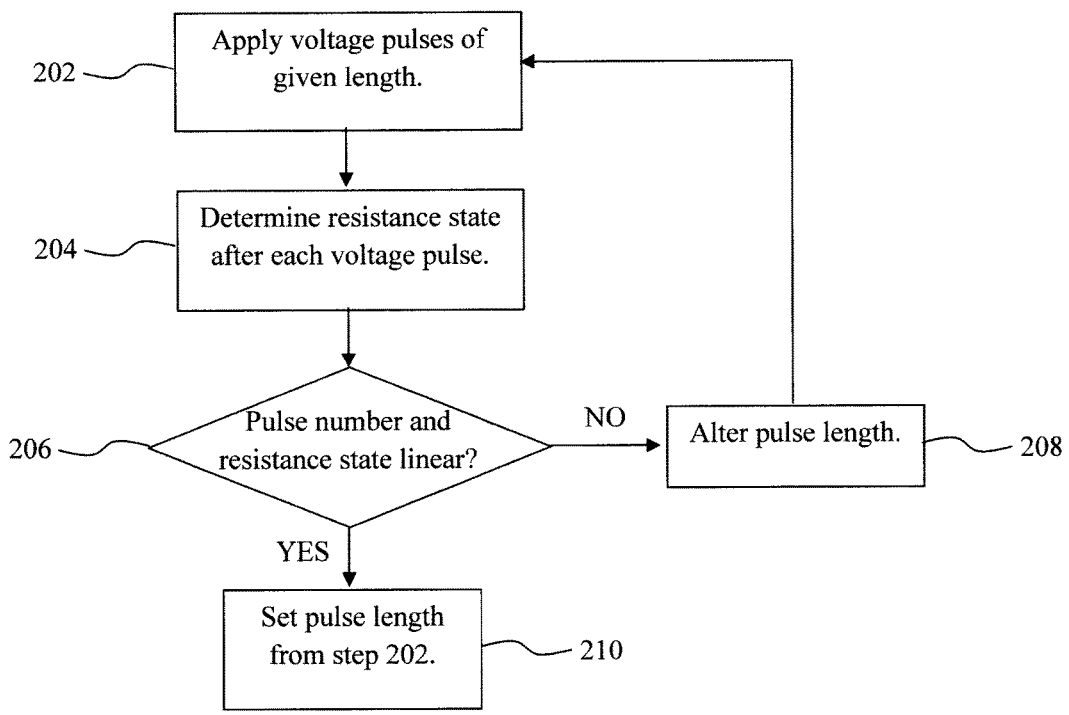
FIG. 2 is a diagram illustrating an exemplary methodology for predetermining voltage pulse length for a memristive device according to an embodiment of the present invention.

A requirement of the semiconductor is that the Schottky Barrier height can be tuned. For instance, with some semiconductors the Fermi level is pinned at the metal electrode/ semiconductor interface and thus always has the same Schottky Barrier height. See, for example, Lee et al., "Interface dipole at metal-organic interfaces: Contribution of metal induced interface states," Applied Physics Letters 94, 113304 (March 2009), (hereinafter "Lee"), the contents of which are incorporated by reference as if fully set forth herein. However, as shown in FIG. 2 of Lee, the barrier height of organic semiconductors such as Tris(8-hydroxyquinolinato)aluminum (abbreviated Alq$_3$) deposited on metal vary with changes in the workfunction of the metal.

Thus, the goal is to alter/vary the workfunction of the metal electrode (of the Schottky junction) and observe a change in barrier height. However, in practice one cannot expect to be able to swap out one metal for another in the electrode to change the workfunction thereof. Advantageously, it has been found herein that changes to the workfunction of the metal electrode can be dynamically effectuated by assembling workfunction-modifying (e.g., dipole or charged) molecules at the (semiconductor/metal electrode) interface that can inject or remove charge, or influence the Schottky barrier height through an electrical screening effect. Specifically, the present device is fabricated with these workfunction-modifying molecules distributed near or at the interface with the top metal electrode, e.g., in the semiconductor layer itself, or in a separate layer between the semiconductor layer and the top metal electrode—see below. As provided above, the workfunction-modifying molecules can include dipole or charged molecules. While a dipole molecule has a charge distribution within the molecule, it has a net charge of zero.

Workfunction modification of the metal electrode via dipole molecules is accomplished by applying a voltage pulse with a predetermined pulse length to the device (see below) which causes the dipole molecules to rotate in place along the electric field, aligning themselves at the (semiconductor/metal electrode) interface (see below). Due to the zero net charge, dipole molecules will not migrate under the electric field, but merely rotate in place. A charged molecule, on the other hand, has a non-zero net charge and thus, in addition to rotating under the electric field can also migrate throughout the layer in which they are present, be it the semiconductor layer or separate layer on the semiconductor.

In either case, when a voltage pulse is applied to the semiconductor material, the workfunction-modifying molecules align themselves relative to the metal electrode. Whether the positive end of a molecule rotates toward, or away from, the metal electrode is dependent on whether a positive (+) or negative (−) voltage pulse is employed. The mechanism for tuning metal workfunction via these molecules is described in detail below.

Preferably, the voltage pulse is applied to the device with a given pulse length (which denotes a length of time the voltage pulse is applied to the device, such as microsecond or nanosecond pulses) that is configured such that multiple applications of the voltage pulse (of the given pulse length) effectuate multiple (resistance) state changes in the device. Further, the resistance range of the device operation preferably provides a linear change of the resistance upon the number of applied voltage pulses. The notion here is that the resistance state of the device will change whenever one or more of the workfunction-modifying molecules rotates either partially or fully, and that the duration of the pulse (i.e., pulse length) can be configured to cause multiple/different configurations of the molecules and hence multiple/different resistance states of the device.

The pulse length employed can be predetermined. For instance, for a given device configuration, voltage pulses of various length can be applied and resistance values obtained until the (predetermined) pulse length is found that results in a linear change of the resistance upon the number of applied voltage pulses. See, for example, methodology 200 of FIG. 2.

Figure 3:
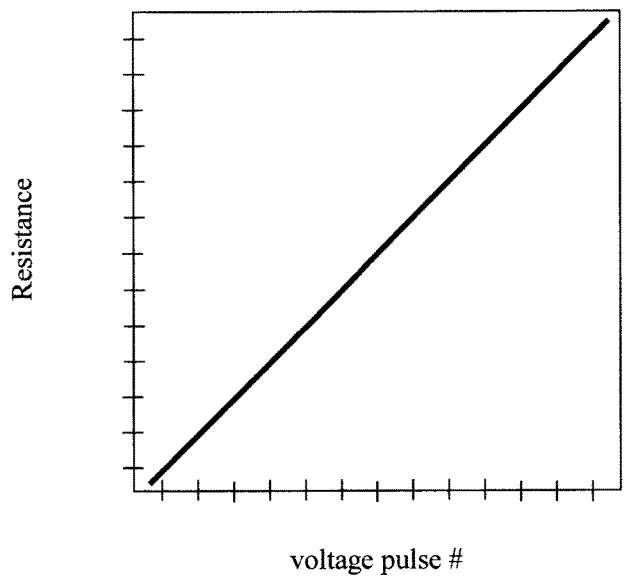
FIG. 3 is a diagram illustrating a desired linear relationship between voltage pulse number and resistance state change according to an embodiment of the present invention.

Specifically, in step 202 (multiple) voltage pulses of a give length are applied to the device and, in step 204, the resistance state of the device after each voltage pulse of the given length is determined. A determination is then made in step 206 as to whether the relationship between the number of voltage pulses applied and the resistance state after each pulse is linear. See, for example, FIG. 3 which depicts such a linear relationship.

If it is determined in step 206 that (NO) the voltage pulses applied do not effectuate a linear change in resistance, then the pulse length is altered in step 208, and the process is repeated beginning again at step 202 with the altered pulse length. On the other hand, if it is determined in step 206 that (YES) the voltage pulses applied effectuate a linear change in resistance, then in step 210 the pulse length is set at the pulse length from step 202, which can then serve as the "predetermined" pulse length used during operation of the device.

Alternatively, a feedback mechanism may be employed whereby the change in device resistance is monitored as a voltage pulse is applied to the device. Once a desired resistance change occurs, the voltage pulse is stopped. This regulatory system can be implemented using a simple feedback circuit. See, for example, methodology 400 of FIG. 4 and feedback circuit 500 in FIG. 5.

Figure 4:
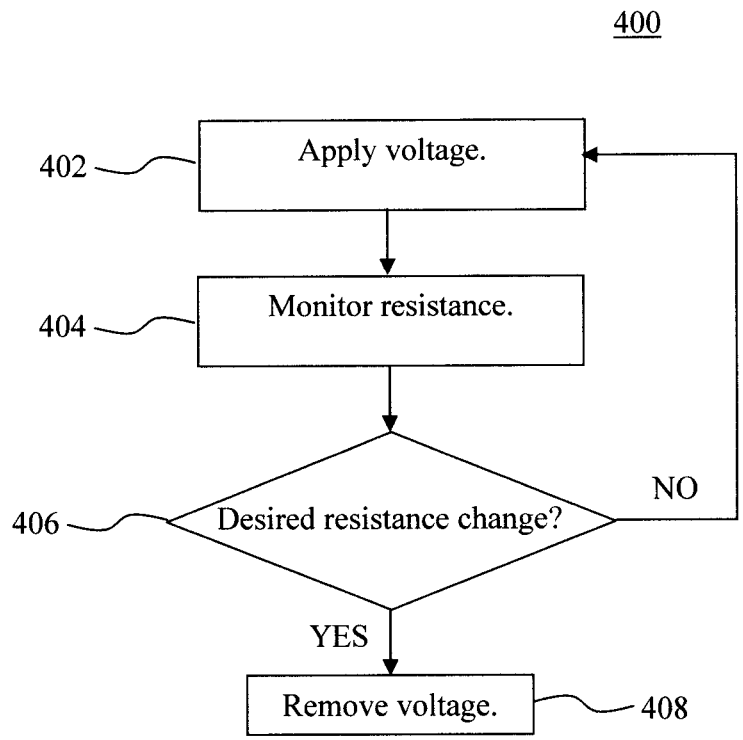
FIG. 4 is a diagram illustrating an exemplary methodology for regulating voltage pulse length using resistance feedback according to an embodiment of the present invention.
Figure 5:
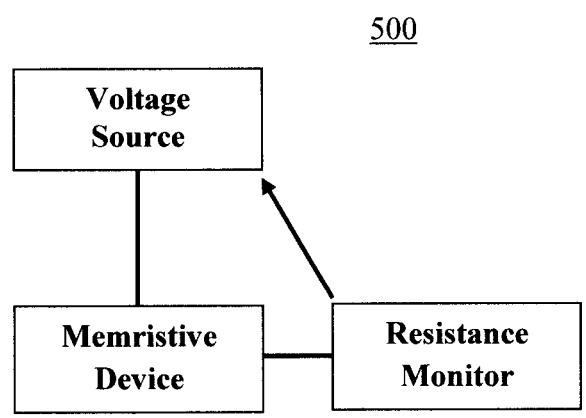
FIG. 5 is a diagram illustrating a resistance feedback circuit for regulating voltage pulse length according to an embodiment of the present invention.
Figure 6:
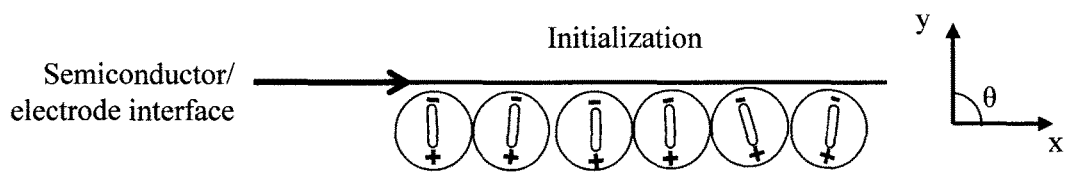
FIG. 6 is a diagram illustrating workfunction-modifying molecules at semiconductor/electrode interface at initialization according to an embodiment of the present invention.

Referring to FIG. 4, in step 402 a voltage is applied to the device and in step 404 the resistance of the device is monitored. By way of example only, a voltage source can be used to apply the voltage to the memristive device, and a resistance monitoring circuit can be used to monitor the resulting change in resistance. See FIG. 5.

In step 406 a determination is made as to whether the desired resistance change has occurred. By way of example only, the desired resistance change can be selected so as to achieve the linear relationship depicted in FIG. 3. If it is determined in step 406 that (NO) the desired resistance change has not yet been achieved, then the applied voltage is continued (extending the duration of the pulse) under monitoring until the desired resistance change occurs. On the other hand, if it is determined in step 406 that (YES) the desired resistance change has been achieved, then the voltage is removed from the device in step 408.

Figure 7:
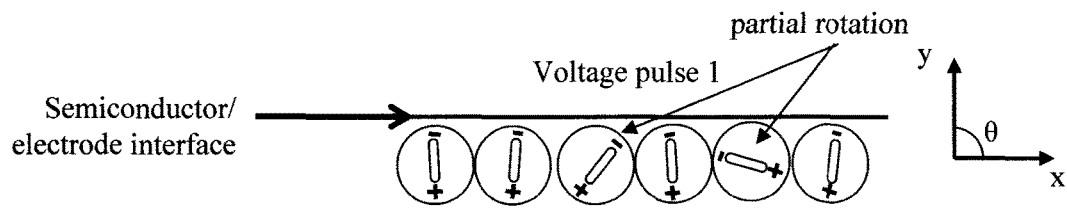
FIG. 7 is a diagram illustrating some of the workfunction-modifying molecules beginning to rotate in response to a first applied voltage pulse of a given length according to an embodiment of the present invention.
Figure 8:
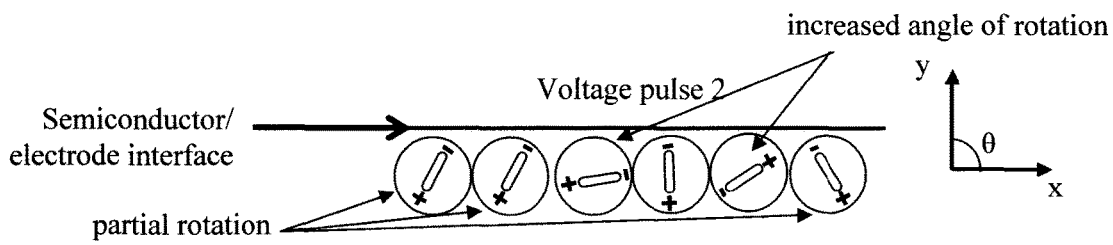
FIG. 8 is a diagram illustrating other workfunction-modifying molecules beginning to rotate as well as further rotation of the molecules occurring in response to a second application of the given voltage pulse length according to an embodiment of the present invention.
Figure 9:
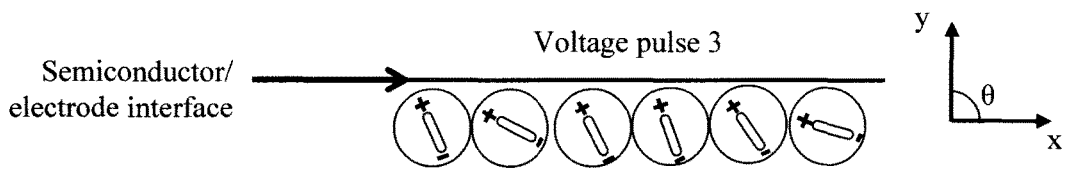
FIG. 9 is a diagram illustrating further rotation of the molecules occurring in response to a third application of the given voltage pulse length according to an embodiment of the present invention.

The above-described concept of achieving multiple resistance states by partially/fully rotating one or more of the workfunction-modifying molecules is now described in further detail by way of reference to FIGS. 6-9. Assume for instance that initially the workfunction-modifying molecules are fully-aligned at the semiconductor/metal electrode) interface, meaning that the positive/negative ends of the molecules are all pointing in the same direction, e.g., toward/away from the metal electrode. See FIG. 6. A voltage pulse of opposite polarity, if long enough in duration, will cause all of the molecules to rotate 180° (as per their angle of rotation) with their positive/negative ends pointing in the opposite direction relative to the metal electrode. However, a voltage pulse of a shorter duration can cause some (but not all) of the molecules to rotate (fully or partially) and/or one or more of the molecules to partially rotate. See FIG. 7. Namely, as shown in FIG. 7 some of the molecules will begin to rotate in response to a first voltage pulse of a given pulse length l. A key to rotation angle (θ) of the molecules is given to the right of the figures. This will register a different resistance state of the device. Again applying the voltage pulse of predetermined length will cause other molecules to rotate (fully or partially) and/or further rotate partially rotated molecules (i.e., increasing the angle (θ) of rotation. See FIG. 8. This will register yet another different resistance state of the device, and so on (i.e., repeated applications of the given pulse length will continue to affect the angle of rotation of the molecules and hence the resistance state of the device, see FIG. 9). As a result, multiple state changes can be realized via the workfunction-modifying molecules, and properly configured voltage pulses. Of course, the number of pulse applications shown is merely exemplary, and more/fewer pulses can be implemented in practice to achieve the desired linear relationship as described above.

Figure 10:
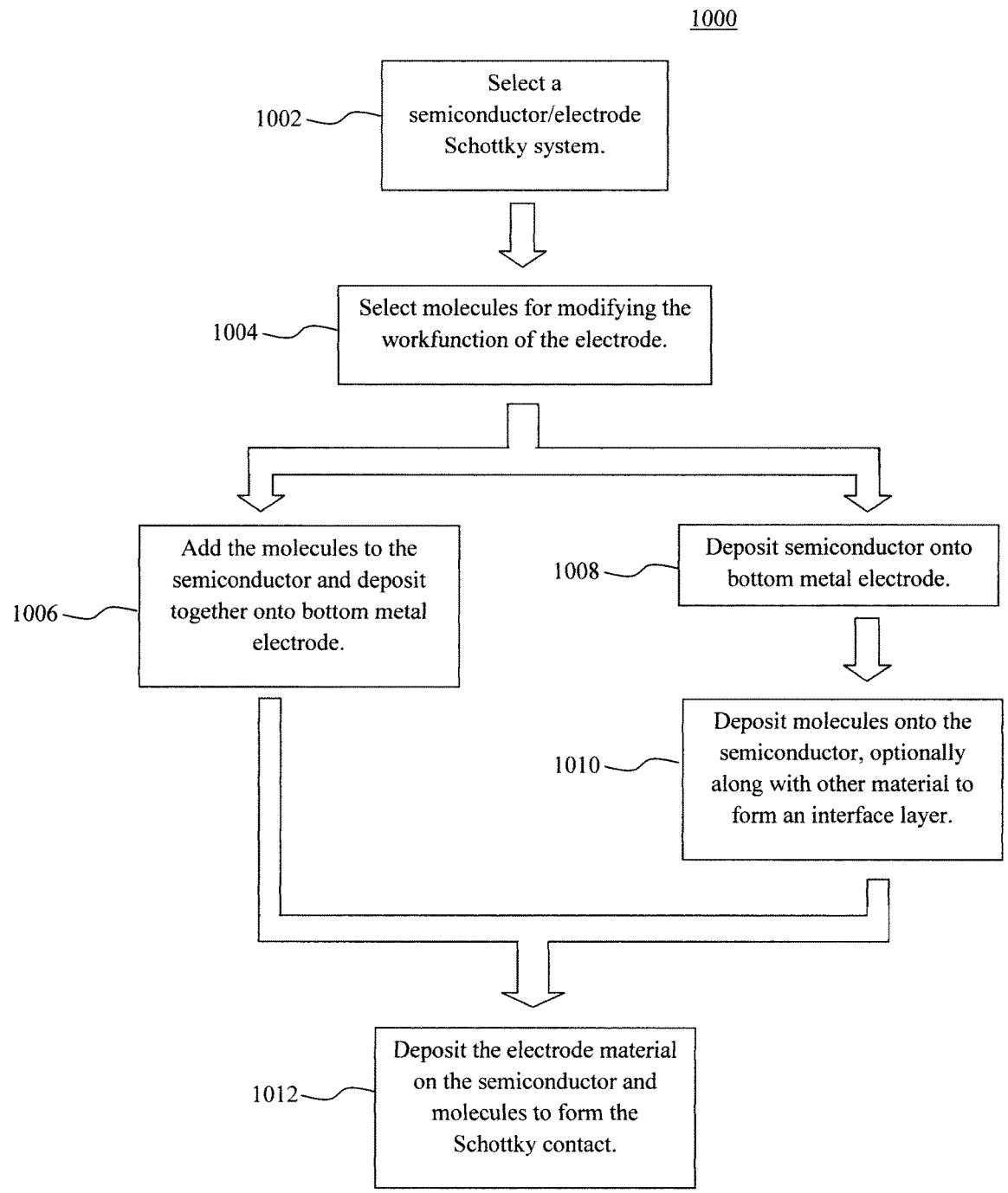
FIG. 10 is a diagram illustrating an exemplary methodology for forming a memristive device according to an embodiment of the present invention.

Given the above overview, exemplary embodiments are now described for fabricating and operating the present memristive devices. For example, FIG. 10 is a diagram illustrating an exemplary methodology 1000 for forming a memristive device. In step 1002, a semiconductor and electrode Schottky system is selected. Suitable semiconductors include, but are not limited to, organic polymers such as Tris(8-hydroxyquinolinato)aluminium, polyaniline (abbreviated as PANI), poly 3-hexylthiophenes (P3HT), poly[2-methoxy-5-(2'-ethyl-hexyloxy)-1,4-phenylene], poly-phenelyne vinylenes (PPV), phthalocyanines, poly-vinyl phenols, pentacene, poly vinyl alcohols, poly carbazoles, and/or poly-pyrrole. Suitable electrode materials include, but are not limited to, metals such as gold (Au), platinum (Pt), aluminum (Al), palladium (Pd), nickel (Ni), titanium (Ti), silver (Ag), and/or indium (In), and/or electrically conductive metal oxides such as zinc oxide, tin oxide, indium oxide, and/or indium-tin-oxide. An electrode formed from a metal(s) and/or metal oxide(s) may be generally referred to herein as a "metal electrode."

In step 1004, a workfunction-modifying molecule is chosen for modifying the workfunction of the metal electrode and hence the barrier height of the device. As provided above, suitable workfunction-modifying molecules can include dipole or charged molecules. Suitable dipole molecules include, but are not limited to, alkanes, dimethyl disulfide (DMDS), methylthiolate ($CH_3S$) and other alkyl-thiolates, histidine, phenylalanine, sarcosine, 2-pyridone, tetrafluoro-tetracyanoquinodimethane (F4-TCNQ), 11,11,12,12-tetracyano-9,10-anthraquinodimethane (TCAQ), and/or 5-ethyl-thiophene-2-carboxylic acid. Suitable charged molecules include, but are not limited to, ionic salts such as cesium iodide (CsI), sodium iodide (NaI), and/or sodium chloride (NaCl). See, for example, Bagus et al., "Work Function Changes Induced by Charged Adsorbates: Origin of the Polarity Asymmetry," Physical Review Letters, 100, 126101 (March 2008) (4 pages), the contents of which are incorporated by reference as if fully set forth herein.

The workfunction modifying molecules can be introduced into the device in a number of different ways. For instance, in one exemplary embodiment (see step 1006), the workfunction modifying molecules are added to the semiconductor layer (e.g., the semiconductor and the workfunction modifying molecules are co-dispersed onto the bottom metal electrode). However, the goal is to place the workfunction modifying molecules at the interface of the semiconductor layer and the top metal electrode and, as noted above, dipole molecules have a net charge of zero and thus would not likely migrate to the interface if randomly dispersed within the semiconductor layer due to an applied electric field (they would merely rotate in place). Thus, co-dispersing the semiconductor and the workfunction modifying molecules may best be implemented using the above-referenced charged molecules (having a non-zero net charge) and hence can migrate through the semiconductor layer to the proper interface when a voltage pulse is applied. According to another exemplary embodiment (see steps 1008 and 1010), the workfunction modifying molecules are disposed within a separate layer at the interface, e.g., a layer present between the semiconductor layer and the top metal electrode. In that case, no migration of the molecules is needed to place them at the interface, and all that is needed to operate the device is for the molecules to rotate in place. This configuration is suitable for either polar or charged molecules.

Thus, in step 1006, the workfunction-modifying molecules are added to the semiconductor. For instance, the semiconductor and workfunction-modifying molecules can be co-dispersed in a suitable liquid media to form a dispersion which can then be cast on a bottom metal electrode to form a layer of the semiconductor containing the molecules on the bottom metal electrode. As provided above, the application of a voltage pulse will align the molecules at the interface of the semiconductor layer and the top metal electrode (see below). The choice of liquid media depends on the molecules and polymers to be dispersed. However, some non-limiting representative examples of suitable liquid media include, but are not limited to, organic solvents such as mono- or polysubstituted aromatic solvents (e.g., substituted benzenes, naphthalenes, biphenyls and pyridines), straight-chain, branched or cyclic alkanes, and water. For a detailed listing of suitable organic solvents see, for example, U.S. Pat. No. 7,704,785 issued to Steiger et al., entitled "Organic Semiconductor Solutions, Process for Forming Organic Semiconductor Layers Therewith and Devices Containing Such Layers," the contents of which are incorporated by reference as if fully set forth herein.

The concentration of the workfunction-modifying molecules (typically measured in molecules/$cm^3$) in the semiconductor layer should be sufficient to ensure a full monolayer of coverage at the interface between the semiconductor layer and the top metal electrode (see below) after application of the voltage pulses for resistive switching (see below). Suitable casting processes include, but are not limited to, spin-coating, dip coating, spray-coating, etc.

According to an exemplary embodiment, the semiconductor layer makes Ohmic contact with the bottom metal electrode. An Ohmic contact is an electrical junction between two materials that has a linear current-voltage curve as with Ohm's law. By contrast, a Schottky junction is formed between the semiconductor layer and the top metal electrode meaning that the semiconductor layer makes non-Ohmic contact with the top metal electrode. A non-Ohmic contact does not demonstrate a linear current-voltage curve.

Alternatively, the molecules and the semiconductor constituent components can instead be co-evaporated onto the bottom metal electrode. For example, two thermal evaporation sources (one for the active semiconductor, and one for the molecules), can be heated simultaneously in the appropriate ratio so as to prepare a blended film.

Alternatively, a two step process is employed for placing the semiconductor layer and the workfunction-modifying molecules whereby in step 1008 the semiconductor layer is deposited onto the bottom metal electrode, and in step 1010 the workfunction-modifying molecules are dispersed onto the semiconductor. As provided above, this approach might be favorable when the workfunction-modifying molecules have a net charge of zero and thus merely rotate in place due to the voltage pulse. Hence, this approach places the workfunction-modifying molecules directly at the semiconductor/bottom metal electrode interface.

As provided above, casting, evaporation, etc. may be employed to deposit the semiconductor layer and the workfunction-modifying molecules. The workfunction-modifying molecules can be deposited directly onto the already-formed semiconductor. For instance, the workfunction-modifying molecules can be dispersed in a suitable liquid media (see above), which is then cast onto the surface of the semiconductor layer forming a monolayer of the workfunction-modifying molecules on a side of the semiconductor layer which will be covered by the top metal electrode. The workfunction-modifying molecules may also be mixed with another material (e.g., a solid electrolyte material or any of the above-provided organic polymers) and then cast onto the semiconductor layer to form an interface layer on the semiconductor.

In step 1012, a top metal electrode material is deposited on the semiconductor to form the Schottky contact. In the case where the semiconductor layer contains the workfunction-modifying molecules, the top metal electrode is formed directly on the semiconductor. Similarly, when the workfunction-modifying molecules are merely dispersed on the surface of the semiconductor, then the top metal electrode is formed on the semiconductor layer covering the (monolayer, i.e., a one atom thick layer of molecules) of workfunction-modifying molecules. In the case where the workfunction-modifying molecules are embedded in an interface layer, the top metal electrode is formed on the interface layer, such that the interface layer is present between the semiconductor layer and the top metal electrode.

As provided above, suitable electrode materials include, but are not limited to, Au, Pt, Al, Pd, Ni, Ti, Ag, and/or In. This top metal electrode makes non-Ohmic contact with the semiconductor. The top metal electrode can be deposited onto the semiconductor material using a process such as evaporation, sputtering, electrochemical deposition, etc.

Figure 11:
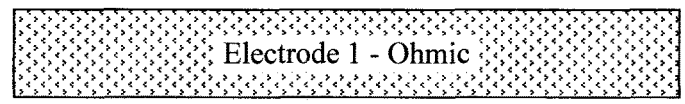
FIG. 11 is a cross-sectional diagram illustrating a bottom metal electrode on which a memristive device is to be built according to an embodiment of the present invention.
Figure 12:
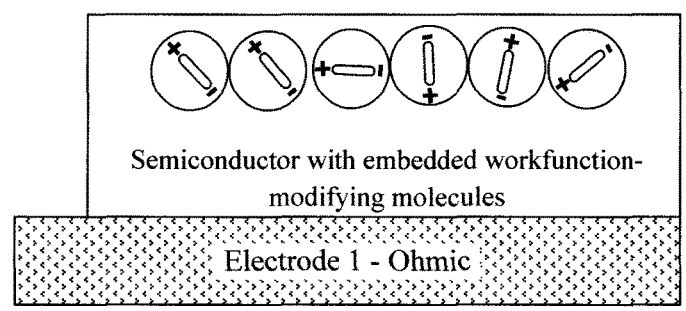
FIG. 12 is a cross-sectional diagram illustrating a semiconductor layer containing workfunction-modifying molecules having been formed on the bottom metal electrode according to an embodiment of the present invention.
Figure 13:
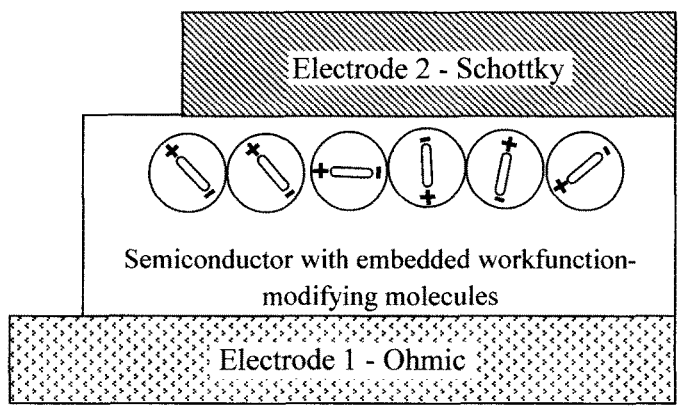
FIG. 13 is a cross-sectional diagram illustrating a top metal electrode having been formed on the semiconductor layer according to an embodiment of the present invention.
Figure 14:
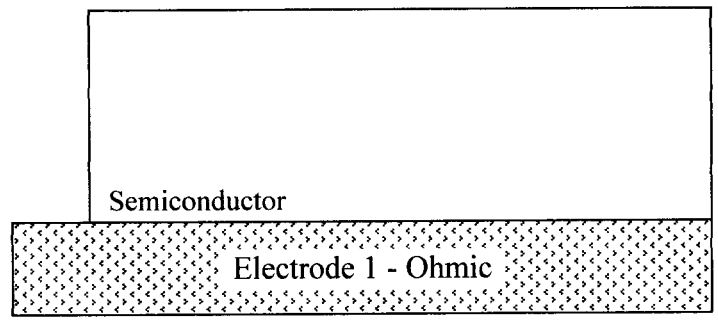
FIG. 14 is a cross-sectional diagram illustrating, according to an alternative embodiment, the semiconductor layer having been formed on the bottom metal electrode according to an embodiment of the present invention.
Figure 15:
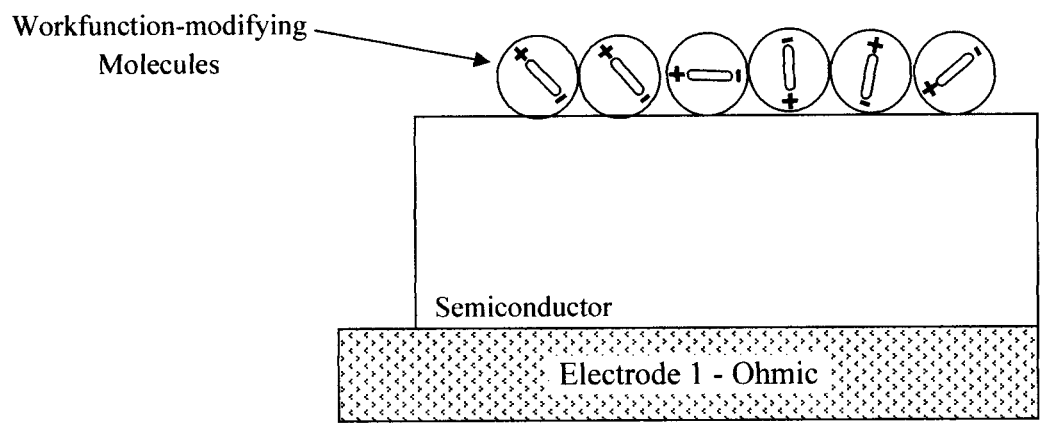
FIG. 15 is a cross-sectional diagram illustrating a layer of the workfunction-modifying molecules having been formed on the semiconductor layer according to an embodiment of the present invention.
Figure 16:
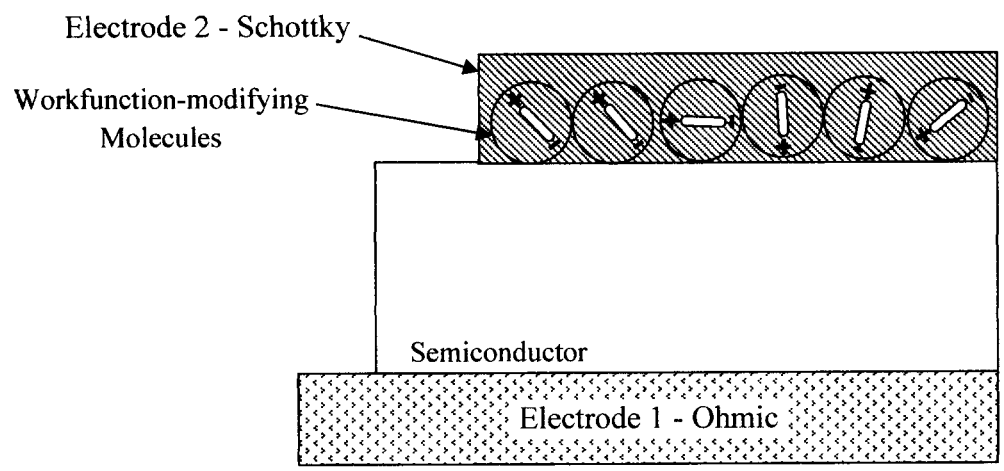
FIG. 16 is a cross-sectional diagram illustrating the top metal electrode having been formed on the semiconductor layer covering the workfunction-modifying molecules according to an embodiment of the present invention.
Figure 17:
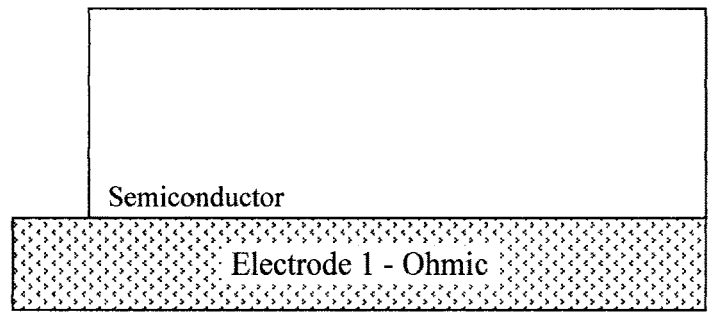
FIG. 17 is a cross-sectional diagram illustrating, according to another alternative embodiment, the semiconductor layer having been formed on the bottom metal electrode according to an embodiment of the present invention.
Figure 18:
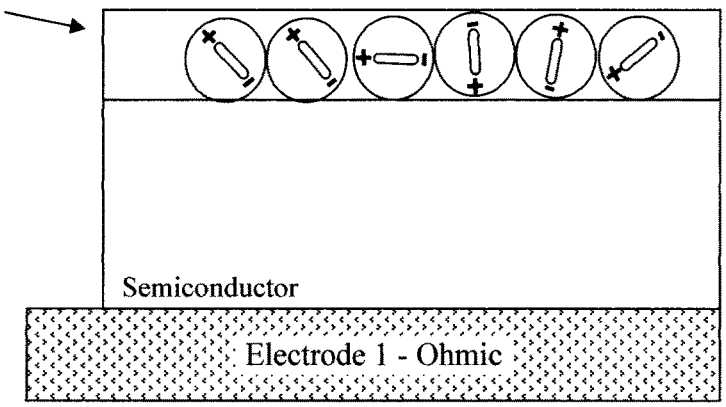
FIG. 18 is a cross-sectional diagram illustrating an interface layer containing the workfunction-modifying molecules having been formed on the semiconductor layer according to an embodiment of the present invention.
Figure 19:
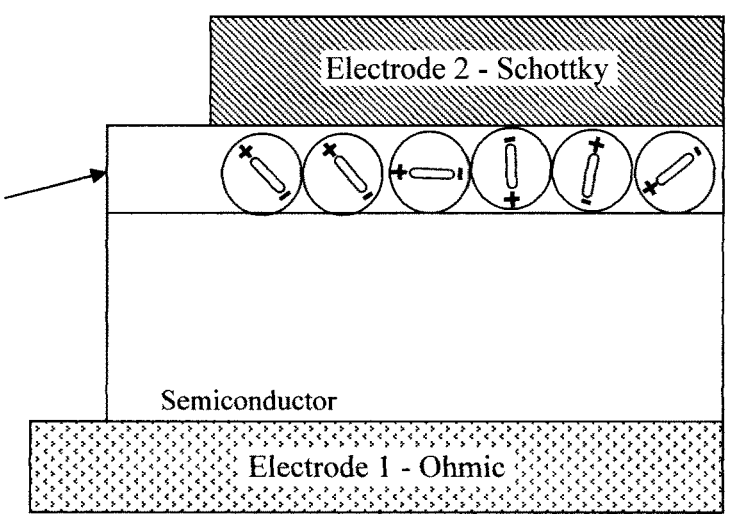
FIG. 19 is a cross-sectional diagram illustrating the top metal electrode having been formed on the interface layer according to an embodiment of the present invention.

Following the process flow outlined in methodology 1000, FIGS. 11-13 depict the steps for forming the present memristive device by embedding the workfunction-modifying molecules in the semiconductor, FIGS. 14-16 depict the steps for forming the present memristive device by depositing a monolayer of the workfunction-modifying molecules on the semiconductor, and FIGS. 17-19 depict the steps for forming the present memristive device by forming an interface layer containing the workfunction-modifying molecules between the semiconductor layer and the top metal electrode In the first example, by way of reference to FIGS. 11-13, as shown in FIG. 11, the process begins with a bottom metal electrode (Electrode 1) on which the memristive device will be built. As highlighted above, this first electrode will make Ohmic contact with the semiconductor. By comparison, the Schottky junction top metal electrode (Electrode 2) that will be formed on the opposite side of the semiconductor layer makes non-Ohmic, typically rectifying contact with the semiconductor. Suitable materials for the bottom metal electrode (Electrode 1) include, but are not limited to, copper (Cu) and/or gold (Au). In general, a different metal will be used for the bottom metal electrode (Electrode 1) than for the top metal electrode (Electrode 2) since the former will make Ohmic contact with the semiconductor, while the latter will make non-Ohmic contact with the semiconductor.

Next, as shown in FIG. 12 a semiconductor layer containing the workfunction-modifying molecules is formed, e.g., cast, co-evaporated, etc. (see above), on the bottom metal electrode. Of course, the dimensions shown in the figures throughout are not necessarily drawn to scale. For instance, the workfunction-modifying molecules are enlarged to show the charge distribution in the molecules. Suitable semiconductor materials and workfunction-modifying molecules were provided above. As shown in FIG. 12, the workfunction-modifying molecules in this example are embedded in the semiconductor layer and are randomly oriented. By "randomly oriented" it is meant that the positive and negative ends of the molecules are not aligned in any particular manner and, as shown in FIG. 12 the ends of the molecules can point in any direction. However, the workfunction-modifying molecules can rotate in place (and even migrate throughout the semiconductor layer if the molecules have a non-zero net charge—see above) and, as described above, an applied voltage can be used to align the molecules relative to the Schottky junction at the interface between the semiconductor layer and the top metal electrode.

Finally, as shown in FIG. 13 a top metal electrode (Electrode 2) is formed (e.g., deposited) onto the semiconductor layer opposite the bottom metal electrode (Electrode 1). The top metal electrode makes non-Ohmic contact with the semiconductor and forms the Schottky junction. Suitable Schottky metal electrode materials were provided above. Standard patterning processes can be implemented in forming the various device configurations described herein, such as patterning by a lift-off process, deposition with a shadow mask, or etching with a mask layer, all of which would be apparent to one skilled in the art.

According to a second exemplary embodiment, the workfunction-modifying molecules are deposited as a monolayer on the semiconductor. As provided above, this configuration is particularly helpful when the molecules have a zero net charge and therefore need to be placed directly at the interface between the semiconductor layer and the top metal electrode. However, this configuration can be implemented with any of the above-described dipole and charged molecules.

In this second example, by way of reference to FIGS. 14-16, as shown in FIG. 14, the process begins with the semiconductor layer being formed, e.g., cast, co-evaporated, etc. (see above), on the bottom metal electrode. As highlighted above, this first electrode will make Ohmic contact with the semiconductor. Suitable materials for the semiconductor layer and bottom metal electrode (Electrode 1) were provided above.

Next, as shown in FIG. 15 a layer of the workfunction-modifying molecules is formed on the semiconductor. For instance, as provided above, the workfunction-modifying molecules can be dispersed in a suitable liquid media, which is then cast onto the surface of the semiconductor layer forming a monolayer of the workfunction-modifying molecules on the semiconductor. Suitable workfunction-modifying (e.g., dipole and charged) molecules were provided above. According to an exemplary embodiment, a monolayer of the molecules (i.e., a layer one atom thick) is formed on the semiconductor. However, the presence of a monolayer is not required, and configurations are contemplated herein where multiple layers of the molecules are implemented and/or an incomplete coverage of the molecules occurs on the semiconductor.

Finally, as shown in FIG. 16 a top metal electrode (Electrode 2) is formed (e.g., deposited) onto the semiconductor layer opposite the bottom metal electrode (Electrode 1) covering the workfunction-modifying molecules. As described above, the top metal electrode makes non-Ohmic contact with the semiconductor layer and forms the Schottky junction. Suitable Schottky metal electrode materials were provided above.

According to a third exemplary embodiment, the workfunction-modifying molecules are embedded within an interface layer between the semiconductor layer and the top metal electrode. Again, this configuration is particularly helpful when the molecules have a zero net charge and therefore need to be placed directly at the interface between the semiconductor layer and the top metal electrode. However, this configuration can be implemented with any of the above-described dipole and charged molecules.

In this third example, by way of reference to FIGS. 17-19, as shown in FIG. 17, the process begins with the semiconductor layer being formed, e.g., cast, co-evaporated, etc. (see above), on the bottom metal electrode. As highlighted above, this first electrode will make Ohmic contact with the semiconductor. Suitable materials for the semiconductor layer and bottom metal electrode (Electrode 1) were provided above.

Next, as shown in FIG. 18, the workfunction-modifying molecules are mixed with another material (e.g., a solid electrolyte or any of the organic polymers provided above), and then cast together onto the semiconductor, forming the interface layer on the semiconductor. Suitable workfunction-modifying (e.g., dipole and charged) molecules were provided above.

Finally, as shown in FIG. 19 a top metal electrode (Electrode 2) is formed (e.g., deposited) onto the interface layer. As described above, the top metal electrode makes non-Ohmic contact with the semiconductor layer and forms the Schottky junction. Suitable Schottky metal electrode materials were provided above.

Figure 20:
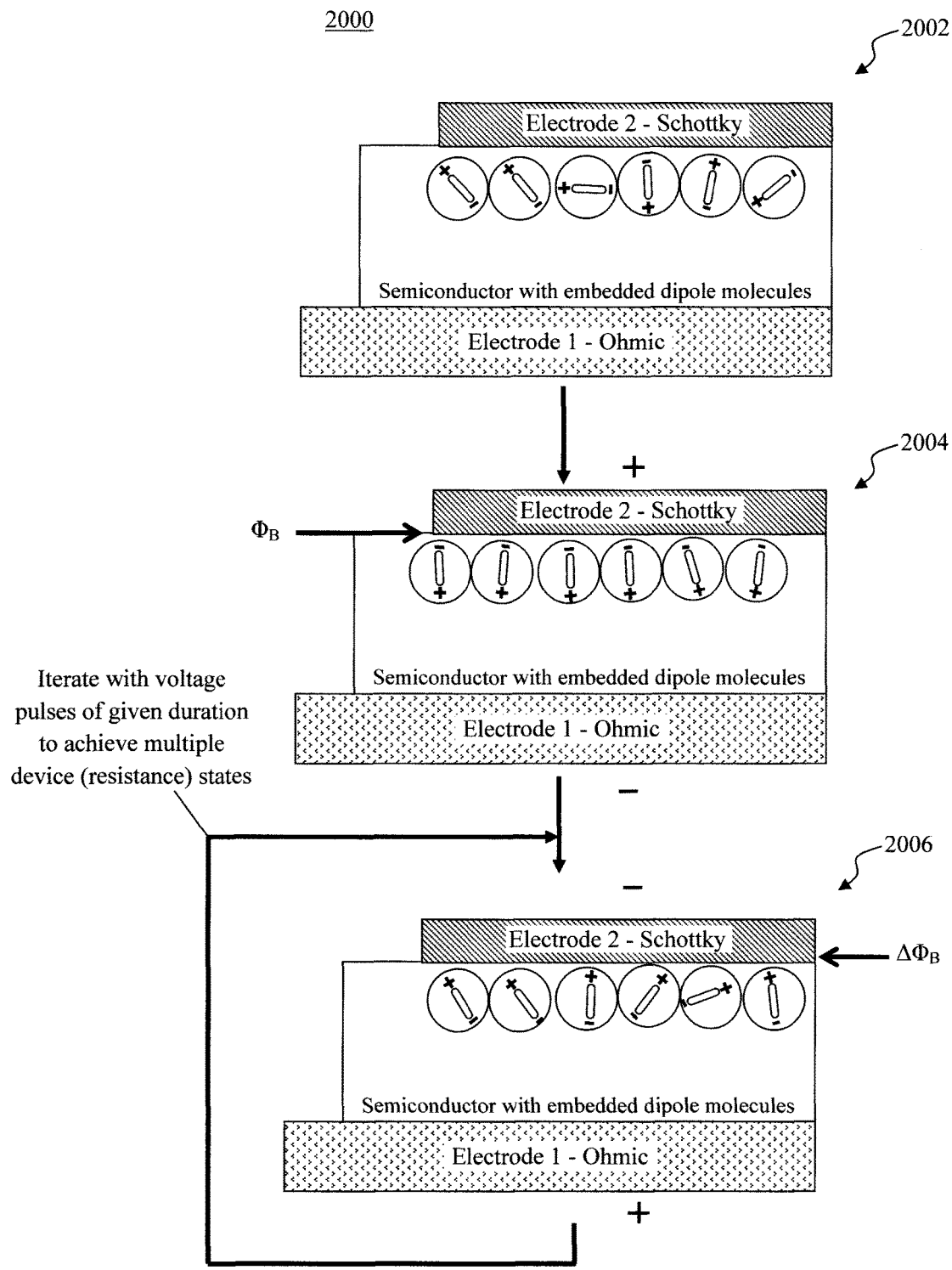
FIG. 20 is a diagram illustrating an exemplary methodology for operating the present memristive device having the workfunction-modifying molecules embedded in the semiconductor layer according to an embodiment of the present invention.

Operation of the present memristive device is now described by way of reference to methodology 2000 of FIG. 20. In this example, the workfunction-modifying molecules are embedded in the semiconductor. As shown in step 2002, initially the workfunction-modifying molecules are randomly oriented near the interface between the semiconductor and the top metal electrode (Electrode 2). By "randomly oriented" it is meant that the positive and negative ends of the molecules are not aligned in any particular manner and, as shown in step 2002 either end of each molecule can point toward, away from, or be parallel to the top metal electrode (Electrode 2).

However, during initialization (see FIG. 6—described above), as shown in step 2004 when a voltage pulse is applied to the top and bottom metal electrodes the workfunction-modifying molecules align along the semiconductor/top metal electrode interface which alters the workfunction of the top metal electrode and thus the Schottky barrier height. In this state, the memristive device has a Schottky barrier height ($\Phi_B$). In this example, a positive voltage is applied to the top metal electrode and a negative voltage is applied to the bottom metal electrode. Thus, as shown in step 2004, the workfunction-modifying molecules will rotate in place so as to align their positive and negative ends at the interface with, in this example, the negative ends of the molecules facing the top metal electrode and the positive ends of the molecules facing the bottom metal electrode.

Applying a first pulse (of a given length/duration) of reverse polarity (i.e., applying a negative voltage to the top metal electrode and a positive voltage to the bottom metal electrode) will cause one or more of the workfunction-modifying molecules to rotate in place (fully or partially) as described in conjunction with the description of FIGS. 6-9 above. See step 2006. As a result, the workfunction of the top metal electrode and thus the Schottky barrier height will be altered by a quantity $\Delta\Phi_B$. As shown in FIG. 20, the process is iterated by applying (second, third, etc.) voltage pulses of the given length/duration to achieve multiple device (resistance) states by fully/partially rotating and/or further rotating the molecules as described in conjunction with the description of FIGS. 6-9 above.

As described above, changing the Schottky barrier height ($\Phi_B$) (as per methodology 2000, or methodologies 2100 and 2200 described below) is used to tune how much current (J) flows through the device. Based on Equation 1, above, these parameters Schottky barrier height ($\Phi_B$) and current (J) are inversely proportional. Accordingly, when Schottky barrier height ($\Phi_B$) increases, the amount of current (J) flowing across the device decreases, and vice versa. Similarly, the low-current state would represent a high resistance state, and vice versa. Thus, the memristive device can be readily used to register a range of resistance states depending on the Schottky barrier height. The resistance state would be "read" by applying a much smaller voltage pulse than is needed to modify the work function (e.g., less than 0.5 volts (V)) and measuring the current, such that the resistance state of the device is unchanged. Higher current measurements at the lower-voltage "read" condition would correspond to a lower resistance state, and vice versa. The ability to dynamically change the Schottky barrier height thus provides for a non-volatile tunable resistance device.

The various potential mechanisms by which the molecules are thought to change the workfunction of a metal are discussed in De Renzi et al., "Metal Work-Function Changes Induced by Organic Adsorbates: A Combined Experimental and Theoretical Study," Physical Review Letters, 95, 046804 (July 2005) (4 pages) (hereinafter "De Renzi"), the contents of which are incorporated by reference as if fully set forth herein. Notably, as shown in FIG. 2 of De Renzi the change in workfunction of the metal electrode is proportional to the percent coverage of dipole molecules on the metal electrode.

The same overall concept for operation applies for the other configurations described herein, such as having a monolayer of the workfunction-modifying molecules themselves or in an interface layer. However, for completeness these examples are depicted in methodology 2100 and methodology 2200 of FIGS. 21 and 22, respectively.

For instance, in methodology 2100 the workfunction-modifying molecules are formed as a layer (e.g., a monolayer) on the semiconductor. As shown in step 2102, initially the workfunction-modifying molecules are randomly oriented near the interface between the semiconductor layer and the top metal electrode (Electrode 2).

However, during initialization (see FIG. 6—described above), as shown in step 2104 when a voltage pulse is applied to the top and bottom metal electrodes the workfunction-modifying molecules align along the semiconductor/top metal electrode interface) which alters the workfunction of the top metal electrode and thus the Schottky barrier height. In this state, the memristive device has a Schottky barrier height ($\Phi_B$). In this example, a positive voltage is applied to the top metal electrode and a negative voltage is applied to the bottom metal electrode. Thus, as shown in step 2104, the workfunction-modifying molecules will rotate in place so as to align their positive and negative ends at the interface with, in this example, the negative ends of the molecules facing the top metal electrode and the positive ends of the molecules facing the bottom metal electrode.

Figure 21:
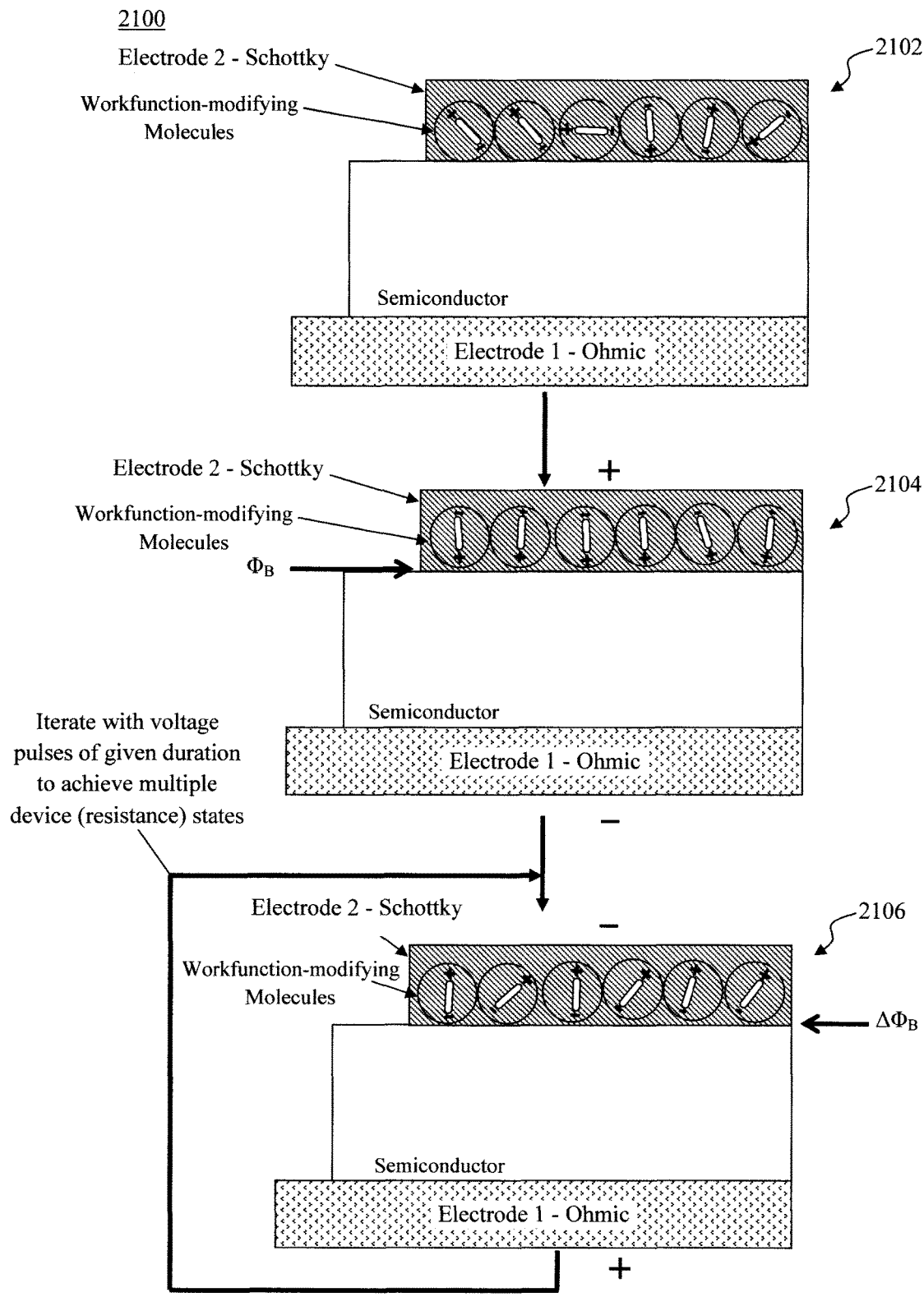
FIG. 21 is a diagram illustrating an exemplary methodology for operating the present memristive device having a monolayer of the workfunction-modifying molecules on the semiconductor layer according to an embodiment of the present invention.

Applying a first pulse (of a given length/duration) of reverse polarity (i.e., applying a negative voltage to the top metal electrode and a positive voltage to the bottom metal electrode) will cause one or more of the workfunction-modifying molecules to rotate in place (fully or partially) as described in conjunction with the description of FIGS. 6-9 above, so that their positive end faces away from the top metal electrode. See step 2106. As a result, the workfunction of the top metal electrode and thus the Schottky barrier height will be altered by a quantity $\Delta\Phi_B$. As shown in FIG. 21, the process is iterated by applying (second, third, etc.) voltage pulses of the given length/duration to achieve multiple device (resistance) states by fully/partially rotating and/or further rotating the molecules as described in conjunction with the description of FIGS. 6-9 above.

In methodology 2200 the workfunction-modifying molecules are embedded within an interface layer between the semiconductor layer and the top metal electrode. As shown in step 2202, initially the workfunction-modifying molecules are randomly oriented near the interface between the semiconductor layer and the top metal electrode (Electrode 2).

However, during initialization (see FIG. 6—described above), as shown in step 2204 when a voltage pulse is applied to the top and bottom metal electrodes the workfunction-modifying molecules align along the semiconductor/top metal electrode interface) which alters the workfunction of the top metal electrode and thus the Schottky barrier height. In this state, the memristive device has a Schottky barrier height ($\Phi_B$). In this example, a positive voltage is applied to the top metal electrode and a negative voltage is applied to the bottom metal electrode. Thus, as shown in step 2204, the workfunction-modifying molecules will rotate in place so as to align their positive and negative ends at the interface with, in this example, the negative ends of the molecules facing the top metal electrode and the positive ends of the molecules facing the bottom metal electrode.

Figure 22:
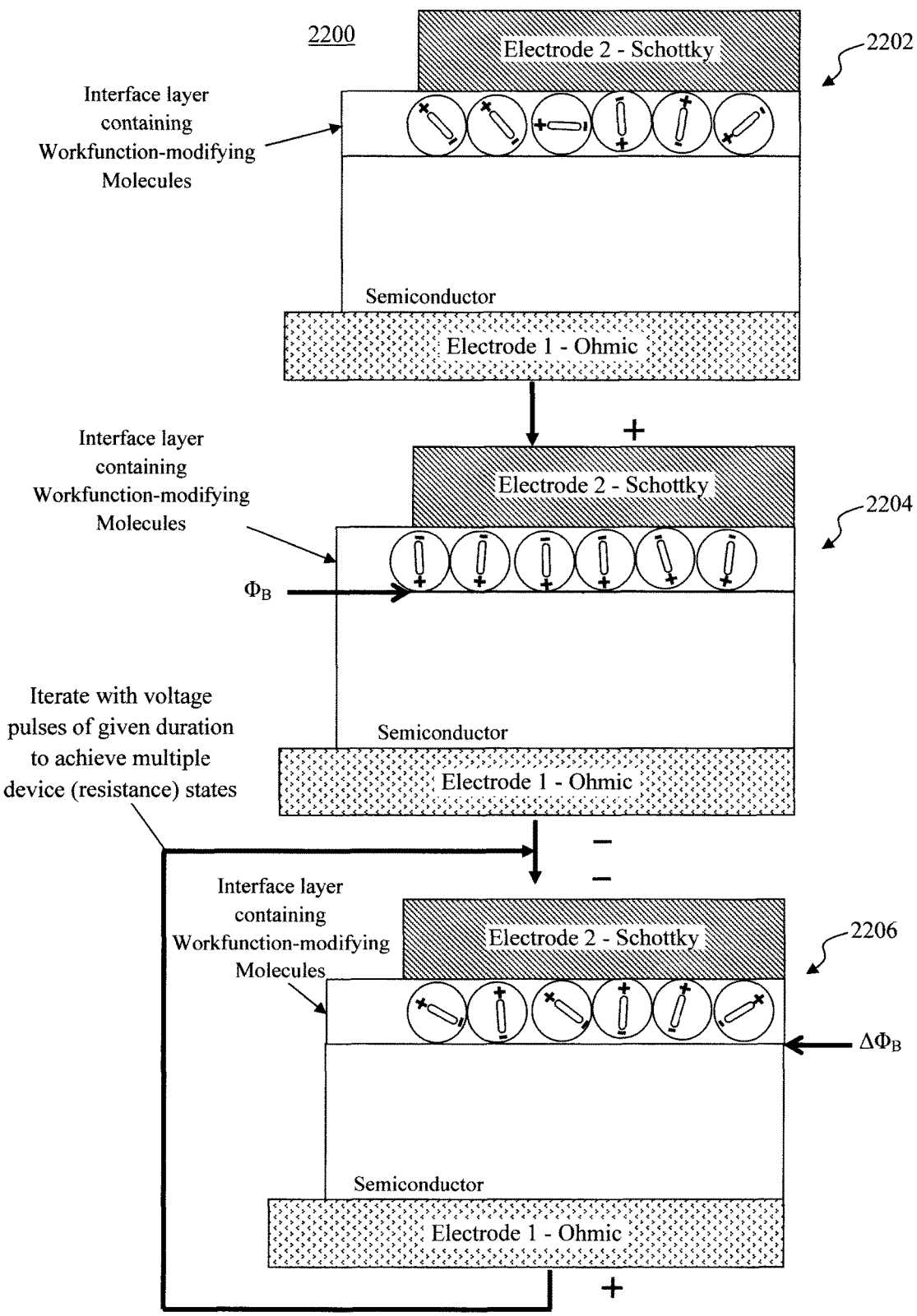
FIG. 22 is a diagram illustrating an exemplary methodology for operating the present memristive device having the workfunction-modifying molecules embedded in an interface layer between the semiconductor layer and the top metal electrode according to an embodiment of the present invention.

Applying a first pulse (of a given length/duration) of reverse polarity (i.e., applying a negative voltage to the top metal electrode and a positive voltage to the bottom metal electrode) will cause one or more of the workfunction-modifying molecules to rotate in place (fully or partially) as described in conjunction with the description of FIGS. 6-9 above, so that their positive end faces the top metal electrode. See step 2206. As a result, the workfunction of the top metal electrode and thus the Schottky barrier height will be altered by a quantity $\Delta\Phi_B$. As shown in FIG. 22, the process is iterated by applying (second, third, etc.) voltage pulses of the given length/duration to achieve multiple device (resistance) states by fully/partially rotating and/or further rotating the molecules as described in conjunction with the description of FIGS. 6-9 above.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a memristive device, the method comprising the steps of:
forming a semiconductor layer on a bottom metal electrode, wherein the semiconductor layer has workfunction-modifying molecules embedded therein, and wherein the semiconductor layer comprises an organic polymer selected from the group consisting of: Tris(8-hydroxyquinolinato)aluminium, polyaniline, poly 3-hexylthiophenes, poly [2-methoxy-5-(2'-ethyl-hexyloxy)-1,4-phenylene], poly-phenelyne vinylenes, phthalocyanines, poly-vinyl phenols, pentacene, poly vinyl alcohols, poly carbazoles, poly-pyrrole, and combinations thereof; and
forming a top metal electrode on the semiconductor layer, wherein the top metal electrode forms a Schottky junction with the semiconductor layer, and wherein the workfunction-modifying molecules are configured to alter a workfunction of the top metal electrode.

2. The method of claim 1, wherein the bottom metal electrode makes Ohmic contact with the semiconductor layer.

3. The method of claim 1, wherein the bottom metal electrode comprises a material selected from the group consisting of: copper, gold, and combinations thereof.

4. The method of claim 1, wherein the workfunction-modifying molecules comprise dipole molecules selected from the group consisting of: alkanes, dimethyl disulfide, alkyl-thiolates, methylthiolate, histidine, phenylalanine, sarcosine,2-pyridone, tetrafluoro-tetracyanoquinodimethane, 11,11,12,12-tetracyano-9,10-anthraquinodimethane, 5-ethyl-thiophene-2-carboxylic acid, and combinations thereof.

5. The method of claim 1, wherein the workfunction-modifying molecules comprise charged molecules selected from the group consisting of: cesium iodide, sodium iodide, sodium chloride and combinations thereof.

6. The method of claim 1, wherein the workfunction-modifying molecules comprise dipole molecules, the method further comprising the steps of:
co-dispersing a semiconductor and the dipole molecules in a liquid media to form a dispersion; and
casting the dispersion onto the bottom metal electrode to form the semiconductor layer having the dipole molecules embedded therein on the bottom metal electrode.

7. The method of claim 1, wherein the workfunction-modifying molecules comprise dipole molecules, the method further comprising the step of:
co-evaporating a semiconductor and the dipole molecules onto the bottom metal electrode to form the semiconductor layer having the dipole molecules embedded therein on the bottom metal electrode.

8. The method of claim 1, wherein the top metal electrode comprises a material selected from the group consisting of: gold, platinum, aluminum, palladium, nickel, titanium, silver, indium, and combinations thereof.

9. A method of forming a memristive device, the method comprising the steps of:
forming a semiconductor layer on a bottom metal electrode;
depositing workfunction-modifying molecules onto the semiconductor layer; and
forming a top metal electrode on the semiconductor layer, wherein the top metal electrode forms a Schottky junction with the semiconductor layer, and wherein the workfunction-modifying molecules are configured to alter a workfunction of the top metal electrode, wherein the method further comprises the steps of:
depositing the workfunction-modifying molecules directly onto the semiconductor layer so as to form a monolayer of the workfunction-modifying molecules on the semiconductor layer; and
forming the top metal electrode on the semiconductor layer covering the monolayer of the workfunction-modifying molecules.

10. A memristive device, comprising:
a bottom metal electrode;
a semiconductor layer on the bottom metal electrode;
a top metal electrode on the semiconductor layer, wherein the top metal electrode forms a Schottky junction with the semiconductor layer; and
workfunction-modifying molecules at an interface between the semiconductor layer and the top metal electrode, wherein the workfunction-modifying molecules are configured to alter a workfunction of the top metal electrode.

11. The memristive device of claim 10, wherein the workfunction-modifying molecules are embedded in the semiconductor layer.

12. The memristive device of claim 10, wherein the workfunction-modifying molecules are disposed directly on the semiconductor layer as a monolayer of the workfunction-modifying molecules, and wherein the monolayer of the workfunction-modifying molecules is covered by the top metal electrode.

13. The memristive device of claim 10, further comprising:
    an interface layer between the semiconductor layer and the top metal electrode, wherein the workfunction-modifying molecules are embedded in the interface layer.

14. The memristive device of claim 10, wherein the bottom metal electrode makes Ohmic contact with the semiconductor layer.

15. The memristive device of claim 10, wherein the bottom metal electrode comprises a material selected from the group consisting of: copper, gold, and combinations thereof.

16. The memristive device of claim 10, wherein the semiconductor layer comprises an organic polymer selected from the group consisting of: Tris(8-hydroxyquinolinato) aluminium, polyaniline, poly 3-hexylthiophenes, poly[2-methoxy-5-(2'-ethyl-hexyloxy)-1,4-phenylene], polyphenelyne vinylenes, phthalocyanines, poly-vinyl phenols, pentacene, poly vinyl alcohols, poly carbazoles, poly-pyrrole, and combinations thereof.

17. The memristive device of claim 10, wherein the workfunction-modifying molecules comprise dipole molecules selected from the group consisting of: alkanes, dimethyl disulfide, alkyl-thiolates, methylthiolate, histidine, phenylalanine, sarcosine, 2-pyridone, tetrafluoro-tetracyanoquinodimethane, 11,11,12,12-tetracyano-9,10-anthraquinodimethane, 5-ethyl-thiophene-2-carboxylic acid, and combinations thereof.

18. The memristive device of claim 10, wherein the top metal electrode comprises a material selected from the group consisting of: gold, platinum, aluminum, palladium, nickel, titanium, silver, indium, and combinations thereof.

19. A method for operating a memristive device, the method comprising the steps of:
    providing the memristive device having a bottom metal electrode, a semiconductor layer on the bottom metal electrode, a top metal electrode on the semiconductor layer, wherein the top metal electrode forms a Schottky junction with the semiconductor layer, and workfunction-modifying molecules at an interface between the semiconductor layer and the top metal electrode; and
    applying a voltage pulse to the bottom metal electrode and the top metal electrode to align the workfunction-modifying molecules along the top metal electrode which alters a workfunction of the top metal electrode and changes a barrier height of the Schottky junction.

20. The method of claim 19, further comprising the step of:
    reversing the voltage pulse to alter the workfunction of the top metal electrode and change the barrier height of the Schottky junction.

21. The method of claim 19, wherein the bottom metal electrode makes Ohmic contact with the semiconductor layer.

* * * * *